United States Patent
Park

(10) Patent No.: US 7,714,499 B2
(45) Date of Patent: May 11, 2010

(54) ORGANIC ELECTRO-LUMINESCENCE DISPLAY HAVING FIRST AND SECOND BARRIER RIBS AND METHOD OF FABRICATING THE SAME

(75) Inventor: Chong Hyun Park, Daegu (KR)

(73) Assignee: LG Electronics Inc., Seoul (KR)

( * ) Notice: Subject to any disclaimer, the term of this patent is extended or adjusted under 35 U.S.C. 154(b) by 650 days.

(21) Appl. No.: 11/082,883

(22) Filed: Mar. 18, 2005

(65) Prior Publication Data

US 2005/0206307 A1    Sep. 22, 2005

(30) Foreign Application Priority Data

Mar. 22, 2004    (KR) .................... 10-2004-0019293

(51) Int. Cl.
*H05B 33/00*    (2006.01)
*H05B 33/22*    (2006.01)
*H01J 1/62*    (2006.01)

(52) U.S. Cl. .................... 313/504; 313/506; 313/505; 445/24; 445/25; 257/40

(58) Field of Classification Search .................... None
See application file for complete search history.

(56) References Cited

U.S. PATENT DOCUMENTS 5,701,055 A * 12/1997 Nagayama et al. .......... 313/504
5,949,188 A    9/1999 Leising et al.
5,962,970 A * 10/1999 Yokoi et al. .................. 313/506
7,122,956 B2 * 10/2006 Ikeda et al. .................. 313/504
2003/0052596 A1    3/2003 Yi et al.
2004/0056590 A1 *  3/2004 Lim et al. .................... 313/506
2004/0119066 A1 *  6/2004 Han et al. ..................... 257/40

FOREIGN PATENT DOCUMENTS

| EP | 0 665 449 A1 | 8/1995 |
| JP | 11074082 A * | 3/1999 |
| KR | 1020040020783 A | 6/2002 |
| KR | 10-2002-0082138 A | 10/2002 |
| WO | WO-01/39272 A1 | 5/2001 |

* cited by examiner

*Primary Examiner*—Sikha Roy
(74) *Attorney, Agent, or Firm*—Birch, Stewart, Kolasch & Birch, LLP

(57) ABSTRACT

An organic electro-luminescence device and a fabricating method thereof wherein an organic light-emitting layer can be provided at an accurate location to prevent a deterioration of picture quality. In the organic electro-luminescence device, a first barrier rib is provided between adjacent organic electro-luminescence cells along a first direction. A second barrier rib is provided between said adjacent organic electro-luminescence cells along a second direction and is positioned between the first barrier ribs.

16 Claims, 14 Drawing Sheets

ORGANIC ELECTRO-LUMINESCENCE DISPLAY HAVING FIRST AND SECOND BARRIER RIBS AND METHOD OF FABRICATING THE SAME

This application claims the benefit of Korean Patent Application No. P2004-19293 filed in Korea on Mar. 22, 2004, which is hereby incorporated by reference.

BACKGROUND OF THE INVENTION

1. Field of the Invention

This invention relates to an electro-luminescence display (ELD), and more particularly to an organic electro-luminescence device and a fabricating method thereof wherein an organic light-emitting layer can be provided at an accurate location to prevent a deterioration of picture quality.

2. Description of the Related Art

Recently, there have been developed various flat panel display devices reduced in weight and bulk that is capable of eliminating disadvantages of a cathode ray tube (CRT). Such flat panel display devices include a liquid crystal display (LCD), a field emission display (FED), a plasma display panel (PDP) and an electro-luminescence display device (ELD), etc. Particularly, the ELD has a structure in which electrodes are attached onto each side of an organic light-emitting layer basically consisting of a hole carrier layer, a light-emitting layer and an electron carrier layer. The ELD has been highlighted to be a post-generation flat panel display device owing to characteristics of a wide viewing angle, a high aperture ration and a high chromaticity, etc.

Such an ELD is largely classified into an inorganic ELD and an organic ELD depending upon its used material. The organic ELD has an advantage in that it can be driven with a lower voltage than the inorganic ELD because electrons and holes emit a light while being extinguished after making a pair when electric charges are injected into an organic EL layer provided between a hole injection electrode and an electron injection electrode. Further, the organic ELD has advantages in that it can be formed on a flexible transparent substrate such as plastic and can be driven with a lower voltage (i.e., less than 10V) than the PDP or the inorganic ELD; and it has a relatively small power consumption and an excellent color sense.

FIG. 1 is a perspective view showing a structure of a conventional organic ELD.

Referring to FIG. 1, the organic ELD has an anode electrode 4 and a cathode electrode 12 provided on a substrate 2 in a direction crossing each other.

A plurality of anode electrodes 4 are provided on the substrate 2 in such a manner to be spaced at a desired distance. An insulating film (not shown) having an aperture for each EL cell area is formed on the substrate 2 provided with the anode electrodes 4. On the insulating film, barrier ribs 8 for separating an organic light-emitting layer 10 and the cathode electrode 12 to be provided thereon are positioned. The barrier rib 8 is provided in a direction crossing the anode electrode 4, and has a backward taper structure in which its upper portion has a larger width than its lower portion. The organic light-emitting layer 10 made from an organic compound and the cathode electrode 12 are entirely deposited onto the insulating film provided with the barrier rib 8. The organic light-emitting layer 10 has a hole carrier layer, a light-emitting layer and an electron carrier layer deposited onto the insulating film. Such a passive ELD emits electrons and holes when a driving signal is applied to the anode electrode 4 and the cathode electrode 12. The electrons and holes emitted from the anode electrode 4 and the cathode electrode 12 are recombined within the organic light-emitting layer 10 to generate a visible light. The generated visible light outputs to the exterior via the anode electrode 4 to thereby display a desired picture or image.

Hereinafter, a method of fabricating the conventional organic ELD will be described with reference to FIG. 2A to FIG. 2D.

Firstly, as shown in FIG. 2A, the anode electrode 4 is provided by depositing a metal transparent conductive material onto the substrate 2 made from a soda lime or a vulcanized glass and then patterning it by the photolithography and the etching process. Herein, indium-tin-oxide (ITO) or $SnO_2$ is used as the metal material.

The insulating film (not shown) is formed in such a manner to expose a light-emitting area by coating a photosensitive insulating material onto the substrate 2 provided with the anode electrode 4 by the spin coating technique and then patterning it by the photolithography and the etching process.

As shown in FIG. 2B, the barrier rib 8 is formed by depositing a photosensitive organic material onto the insulating film and then patterning it by the photolithography and the etching process. The barrier rib 8 is provided to divide the pixels in such a manner to cross the plurality of anode electrodes 4.

As shown in FIG. 2C, the organic light-emitting layer 10 is formed on the substrate 2 provided with the barrier rib 8 by utilizing a shadow mask (not shown).

As shown in FIG. 2D, the cathode electrode 12 is formed by depositing a metal material onto the substrate 2 provided with the organic light-emitting layer 10.

Meanwhile, the formation of the organic light-emitting layer 10 by utilizing the conventional shadow mask raises a problem in that an organic light-emitting material passing through a slit of the shadow mask is not secured at an accurate location to generate a formation badness of the organic light-emitting layer 10, thereby causing a deterioration of picture quality.

This will be described in detail with reference to FIG. 3 below.

When a heating vessel 20 contained with a specific organic material (e.g., a light-emitting material 21 for implementing a red (R) color) is heated, the specific organic material 21 (e.g., a light-emitting material 21 for implementing a red (R) color) within the heating vessel 20 is sublimed to be deposited onto the anode electrode 4. Herein, a shadow mask 22 is provided in such a manner to be spaced at a desired distance from the anode electrode 4 as the barrier rib 8 is formed on the barrier rib. Further, as a process tolerance is generated upon fabricating the shadow mask 22, the specific organic material 21 having passed through a slot 24 of the shadow mask 22 is widely spread. Thus, there is raised a problem in that a deposition of it onto the adjacent sub-pixel for implementing a different color (i.e., the sub-pixel for implementing a green (G) color or a blue (B) color) occurs frequently.

Therefore, the formation badness of the organic light-emitting layer 10, such as a mixing of different color organic light-emitting material at each sub-pixel (i.e., R, G or B sub-pixel), or a formation of improper amount of organic light-emitting material, is generated to cause a deterioration of picture quality such as a non-uniformity of picture quality upon a light-emission of the organic ELD.

SUMMARY OF THE INVENTION

Accordingly, it is an object of the present invention to provide an organic electro-luminescence device and a fabricating method thereof wherein an organic light-emitting layer can be provided at an accurate location to prevent a deterioration of picture quality.

In order to achieve these and other objects of the invention, an organic electro-luminescence device according to one aspect of the present invention includes a first barrier rib provided between adjacent organic electro-luminescence cells along a first direction; and a second barrier rib provided between said adjacent organic electro-luminescence cells along a second direction and positioned between the first barrier ribs.

In the organic electro-luminescence device, the second barrier rib is formed from the same material as the first barrier rib.

In the organic electro-luminescence device, the second barrier rib has a smaller width as it goes from the lower portion thereof into the upper portion thereof.

In the organic electro-luminescence device, the second barrier rib has a larger width as it goes from the lower portion thereof into the upper portion thereof.

A method of fabricating an organic electro-luminescence device according to another aspect of the present invention includes the steps of forming a first barrier rib between adjacent organic electro-luminescence cells along a first direction; and forming a second barrier rib provided between said adjacent organic electro-luminescence cells along a second direction and positioned between the first barrier ribs.

In the method, the second barrier rib is formed from the same material as the first barrier rib.

In the method, the second barrier rib has a smaller width as it goes from the lower portion thereof into the upper portion thereof.

In the method, the second barrier rib has a larger width as it goes from the lower portion thereof into the upper portion thereof.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 4 to 7.

Figure 1:
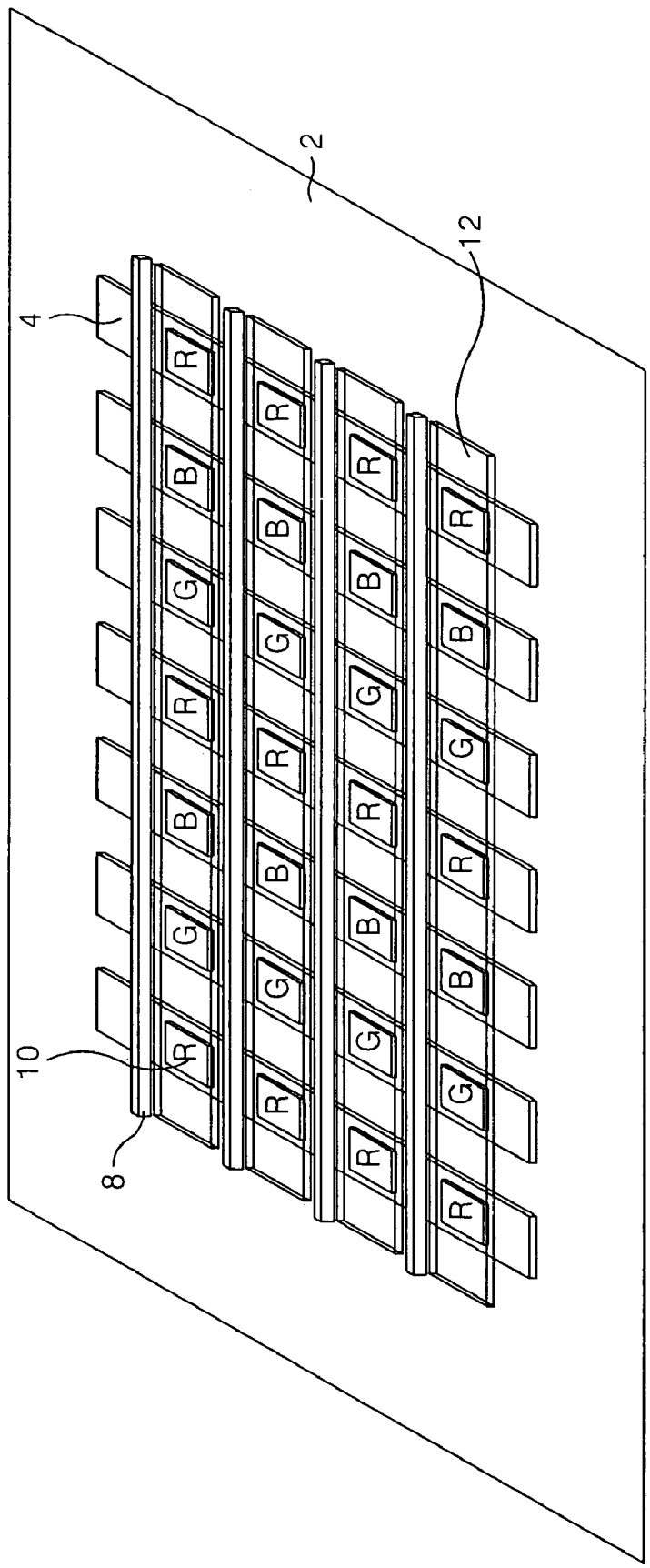
FIG. 1 is a perspective view showing a structure of a conventional organic electro-luminescence device.
Figure 2A:
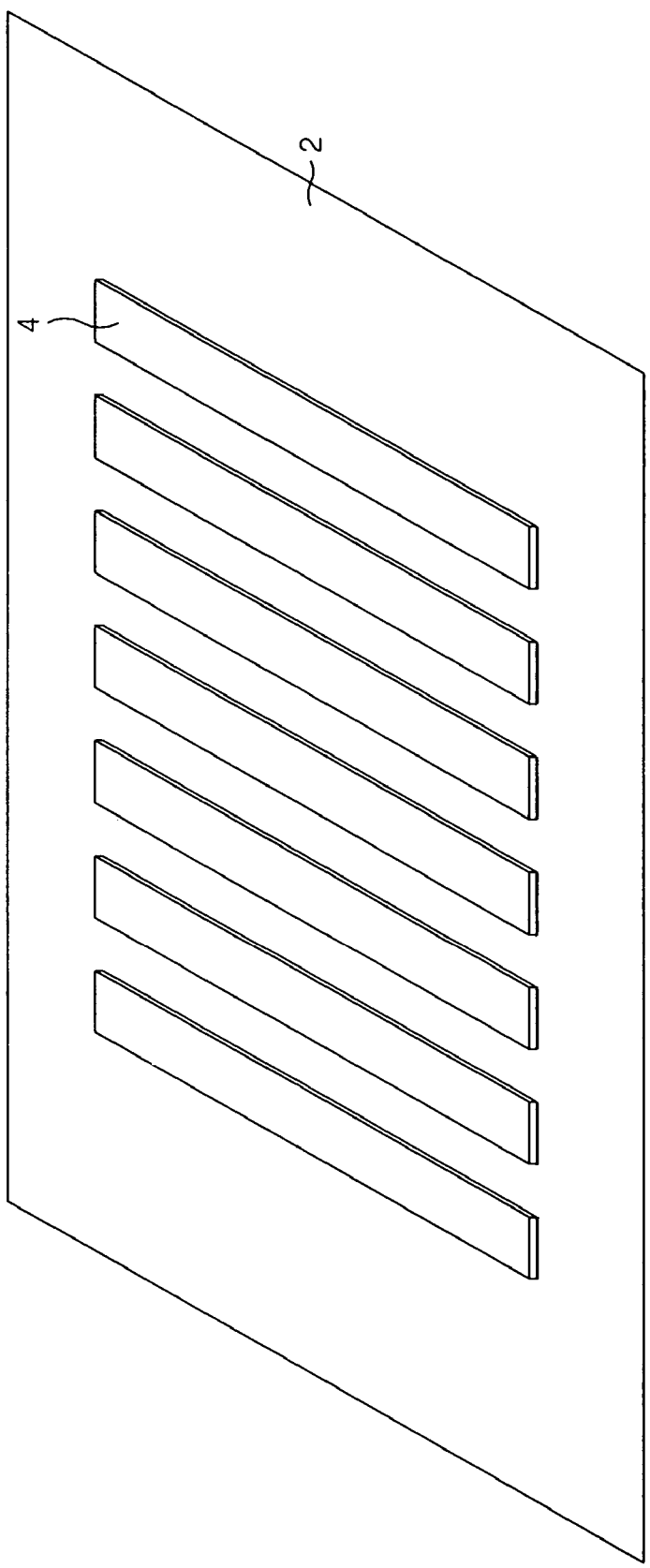
FIG. 2A to FIG. 2D are views for explaining a method of fabricating the conventional organic electro-luminescence device.
Figure 2B:
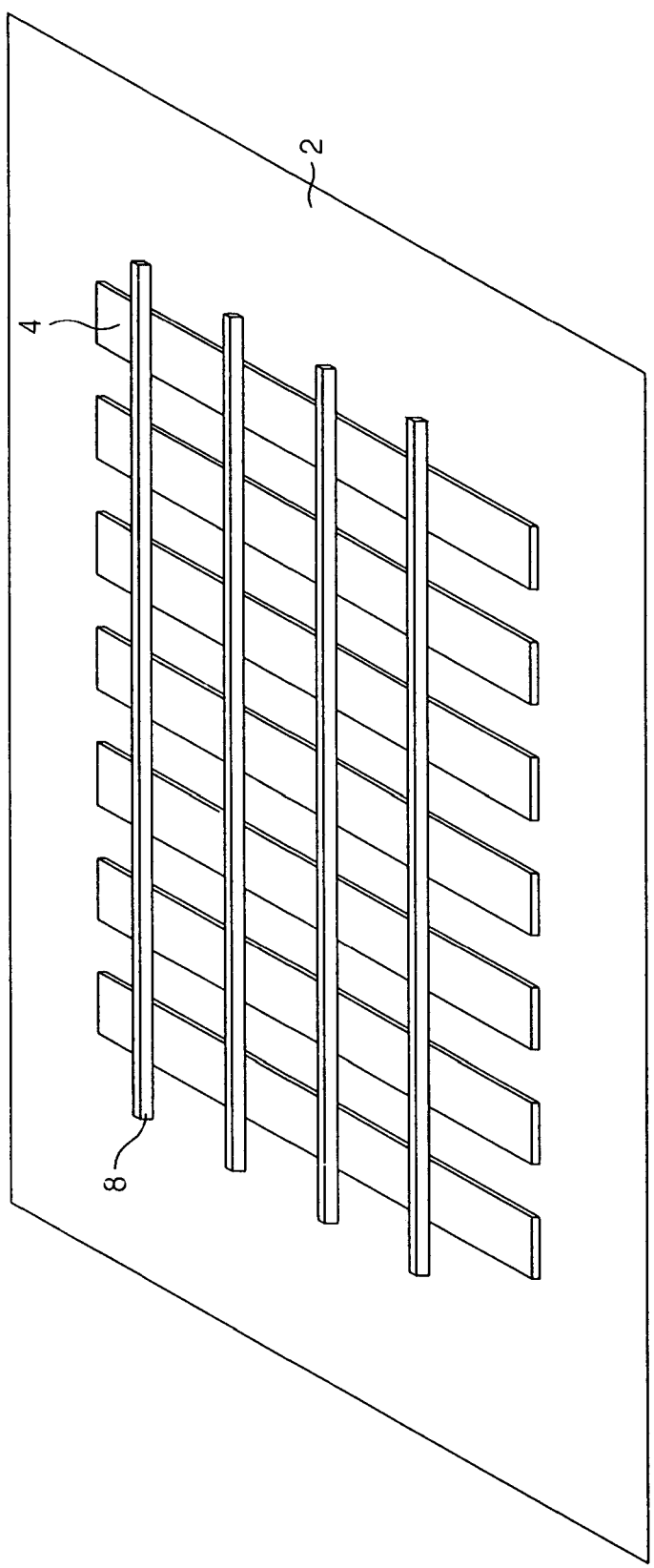
Figure 2C:
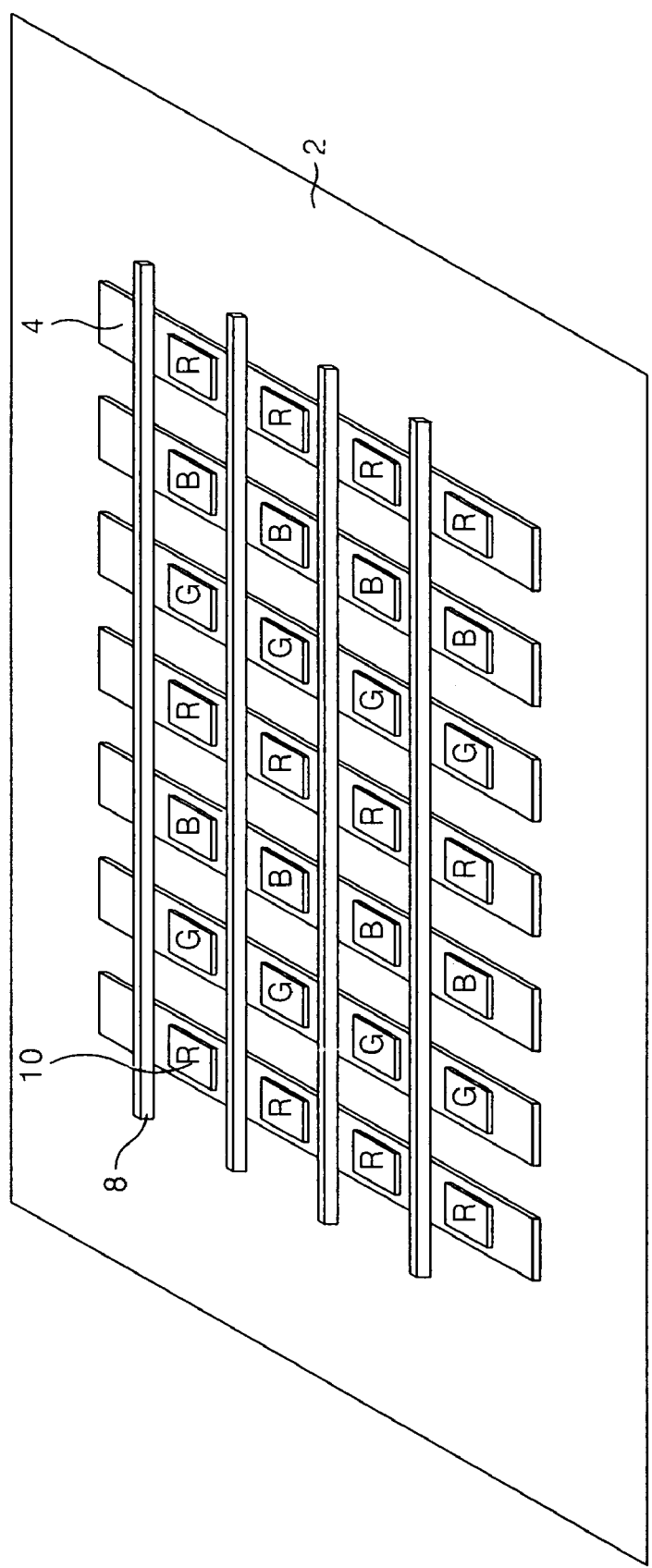
Figure 2D:
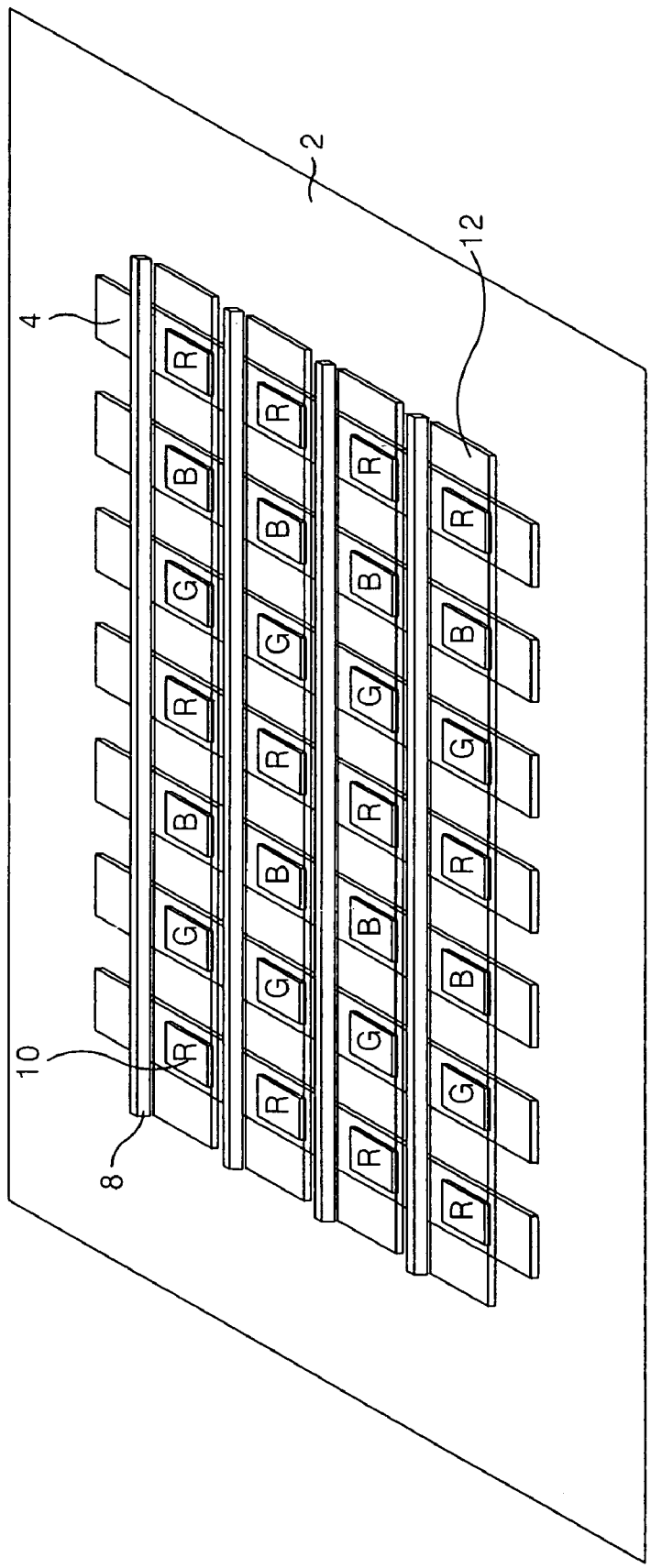
Figure 3:
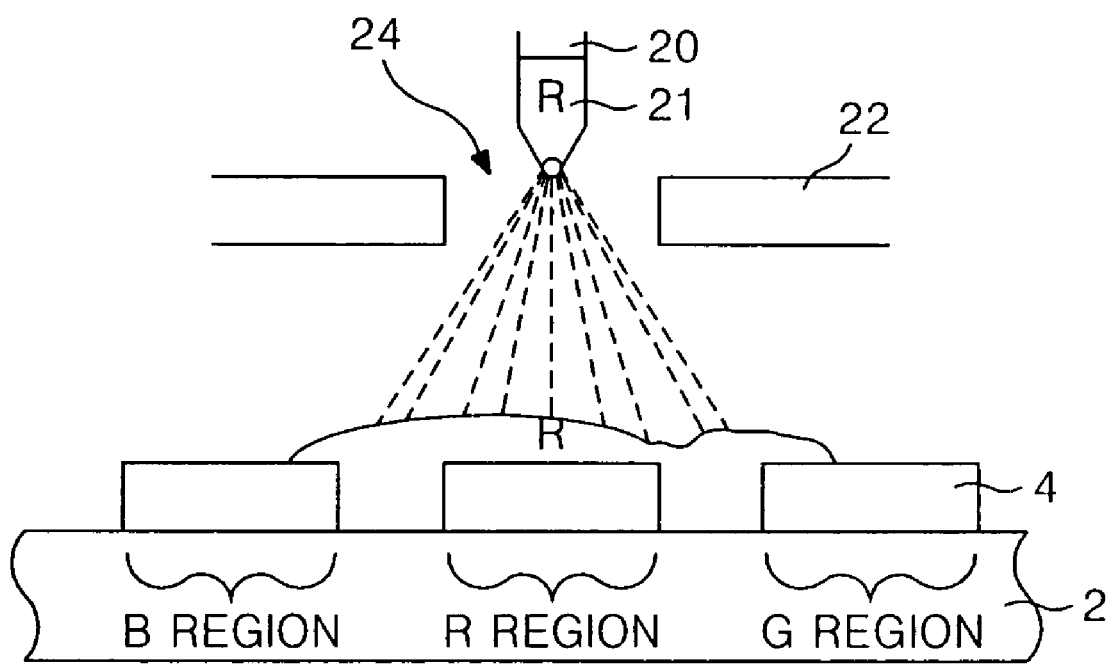
FIG. 3 is a view for showing a bad formation of the organic light-emitting layer in the conventional organic electro-luminescence device.
Figure 4:
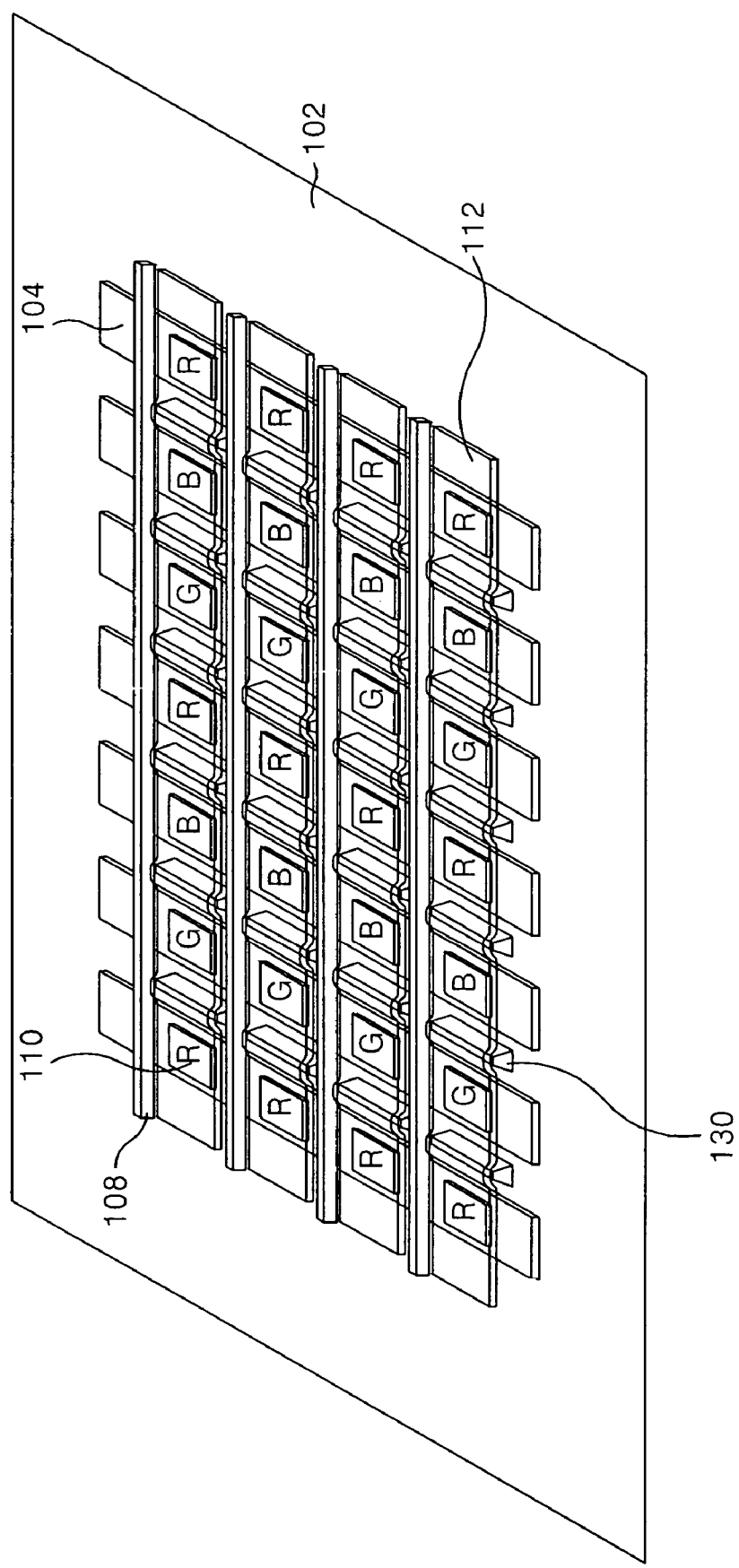
FIG. 4 is a perspective plan view showing a structure of an organic electro-luminescence device according to a first embodiment of the present invention.

FIG. 4 is a perspective plan view showing a structure of an organic electro-luminescence device (ELD) according to a first embodiment of the present invention.

Referring to FIG. 4, the organic ELD has an anode electrode 104 and a cathode electrode 112 provided on a substrate 102 in a direction crossing each other.

A plurality of anode electrodes 104 are provided on the substrate 102 in such a manner to be spaced at a desired distance. An insulating film (not shown) having an aperture for each EL cell area is formed on the substrate 102 provided with the anode electrodes 104. On the insulating film, first barrier ribs 108 for separating an organic light-emitting layer 110 and the cathode electrode 112 for implementing the same color to be provided thereon are positioned. The barrier rib 108 is provided in a direction crossing the anode electrode 104, and has a backward taper structure in which its upper portion has a larger width than its lower portion (i.e., a shape having a larger width as it goes from the lower portion into the upper portion).

On the insulating film provided with the first barrier rib 108, a second barrier rib 130 having a forward taper structure is provided in such a manner to make a direction perpendicular to the first barrier rib 108 and be positioned between it and an organic light-emitting layer 110 for implementing a different color. The second barrier rib 130 is located between organic light-emitting areas for implementing different colors to divide the EL cells implementing different colors, thereby providing the organic light-emitting layer 110 at an accurate location.

Figure 5:
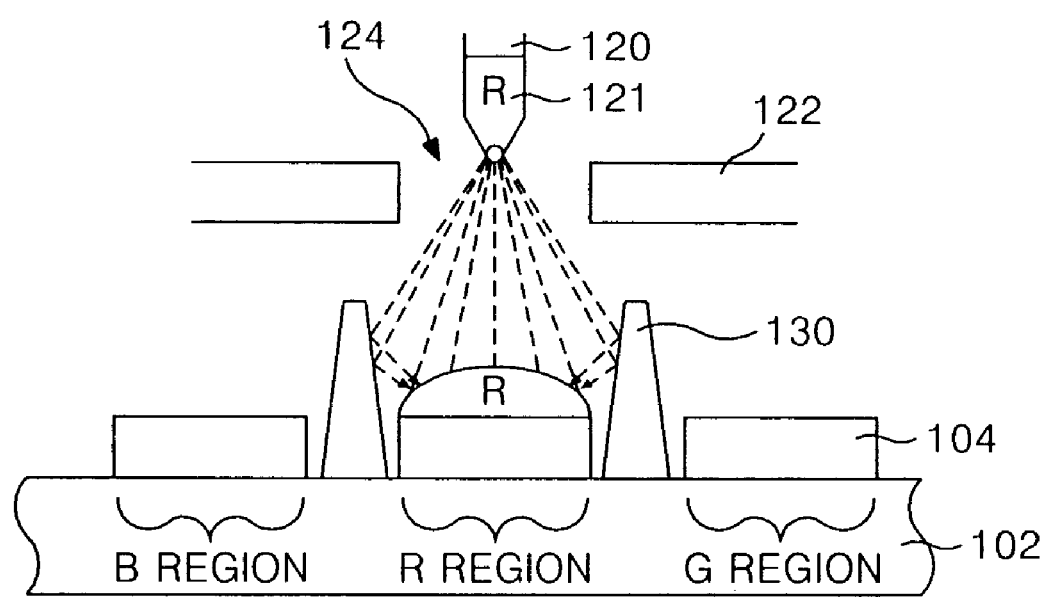
FIG. 5 is a view for showing a normal formation of the organic light-emitting layer shown in FIG. 4.

This will be described in detail with reference to FIG. 5 below.

When a heating vessel 120 contained with an organic material 121 is heated, the specific organic material 121 (e.g., a light-emitting material for implementing a red (R) color) within the heating vessel 120 is sublimed to be deposited onto the anode electrode 104. Herein, even though the specific organic material 121 having passing through a slot 124 of the shadow mask 122 is widely spread due to a height of the first barrier rib 108 and a process tolerance upon fabrication of the shadow mask 122, the second barrier rib 130 positioned between the light-emitting areas for implementing different colors prevents the specific organic material 121 (i.e., the light-emitting material for implementing a red (R) color) from being secured onto the adjacent light-emitting area (i.e., the light-emitting area for implementing a green (G) color or a blue (B) color).

Accordingly, the organic light-emitting layer 110 is provided at an accurate location to thereby prevent a deterioration of picture quality such as a non-uniformity of picture quality.

The organic light-emitting layer 110 made from an organic compound and the cathode electrode 112 are entirely deposited onto the insulating film provided with the second barrier rib 130. The organic light-emitting layer 110 has a hole carrier layer, a light-emitting layer and an electron carrier layer deposited onto the insulating film. Such a passive ELD emits electrons and holes when a driving signal is applied to the anode electrode 104 and the cathode electrode 112. The electrons and holes emitted from the anode electrode 104 and the cathode electrode 112 are re-combined within the organic light-emitting layer 110 to generate a visible light. The generated visible light outputs to the exterior via the anode electrode 104 to thereby display a desired picture or image.

Hereinafter, a method of fabricating the organic ELD according to the first embodiment of the present invention will be described with reference to FIG. 6A to FIG. 6E.

Figure 6A:
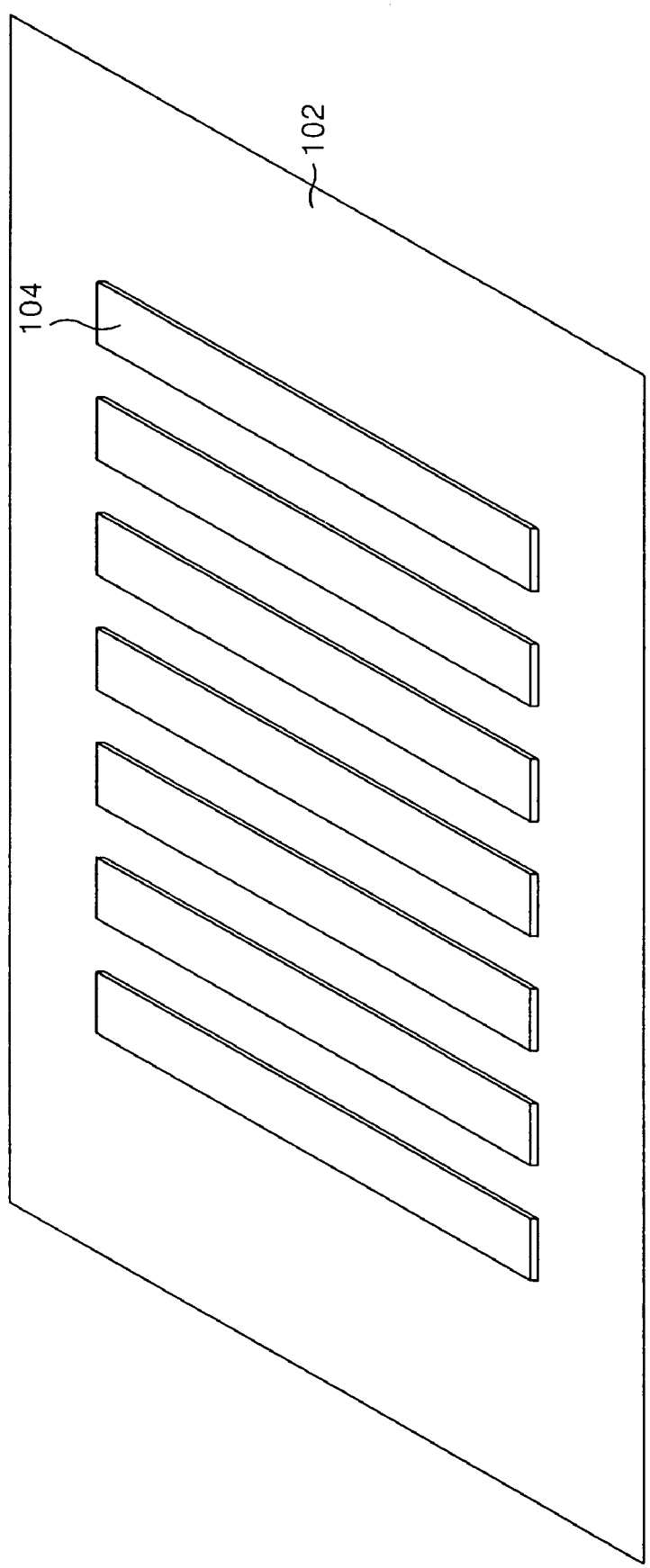
FIG. 6A to FIG. 6E are views for explaining a method of fabricating the organic electro-luminescence device according to the first embodiment of the present invention.

Firstly, as shown in FIG. 6A, the anode electrode 104 is provided by depositing a metal transparent conductive material onto the substrate 102 made from a soda lime or a vulcanized glass and then patterning it by the photolithography and the etching process. Herein, indium-tin-oxide (ITO) or $SnO_2$ is used as the metal material.

The insulating film (not shown) is formed in such a manner to expose a light-emitting area by coating a photosensitive insulating material onto the substrate 102 provided with the anode electrode 104 by the spin coating technique and then patterning it by the photolithography and the etching process.

Figure 6B:
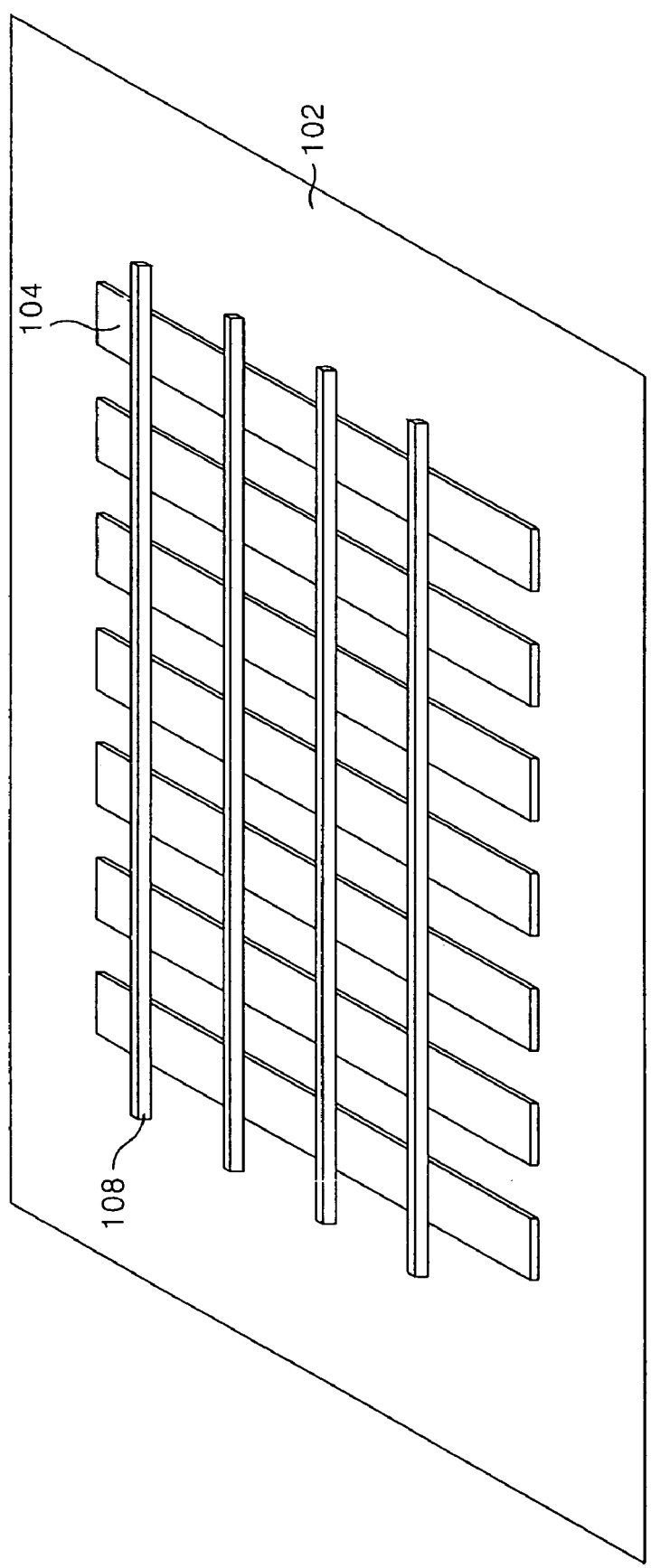

As shown in FIG. 6B, the first barrier rib 108 is formed by depositing a photosensitive organic material onto the insulating film and then patterning it by the photolithography and the etching process. The first barrier rib 108 is provided to divide the pixels in such a manner to cross the plurality of anode electrodes 104.

Figure 6C:
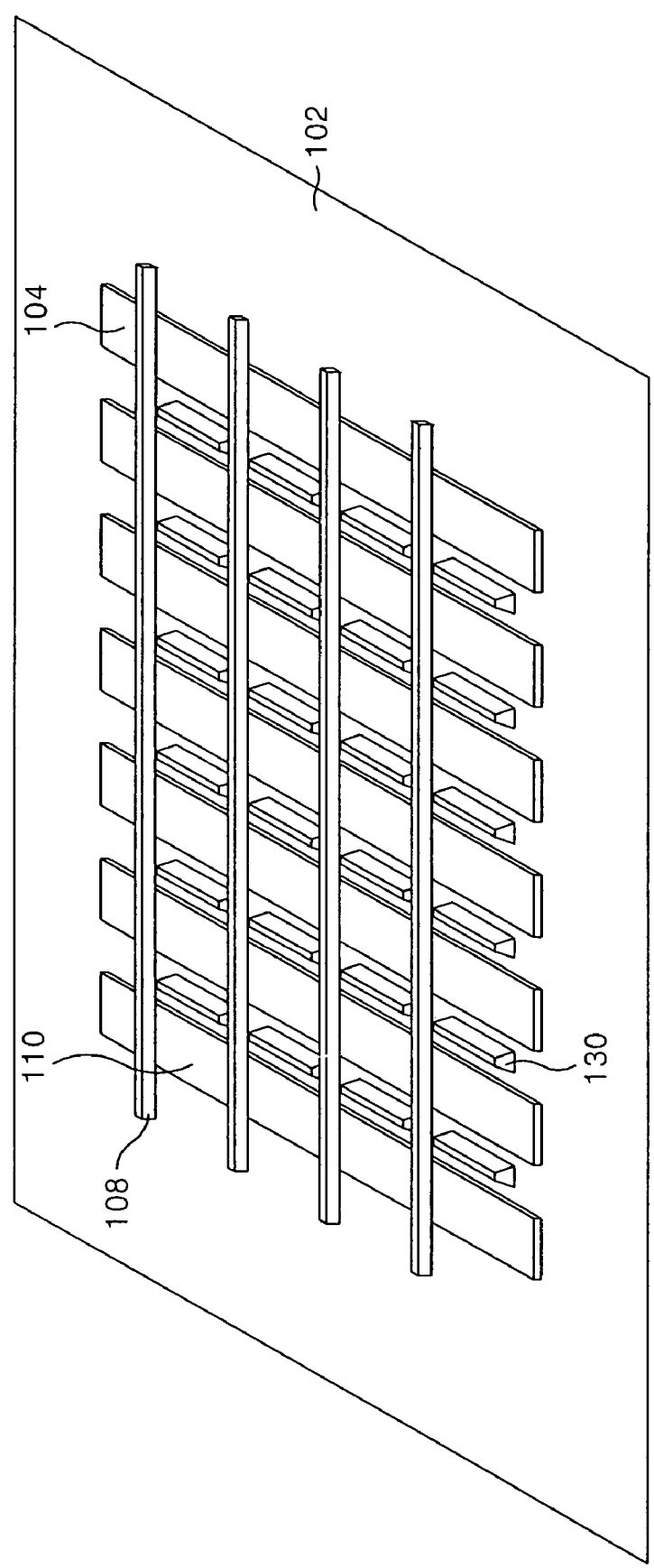

As shown in FIG. 6C, the second barrier rib 130 having a forward taper structure (i.e., a shape having a smaller width as it goes from the lower portion into the upper portion) is provided in such a manner to make a direction perpendicular to the first barrier rib 108 (or parallel to the anode electrode 104) and be positioned between the light-emitting areas for implementing different colors by depositing a photosensitive organic material onto the substrate 102 provided with the first barrier rib 108 and then patterning it by the photolithography and the etching process.

Figure 6D:
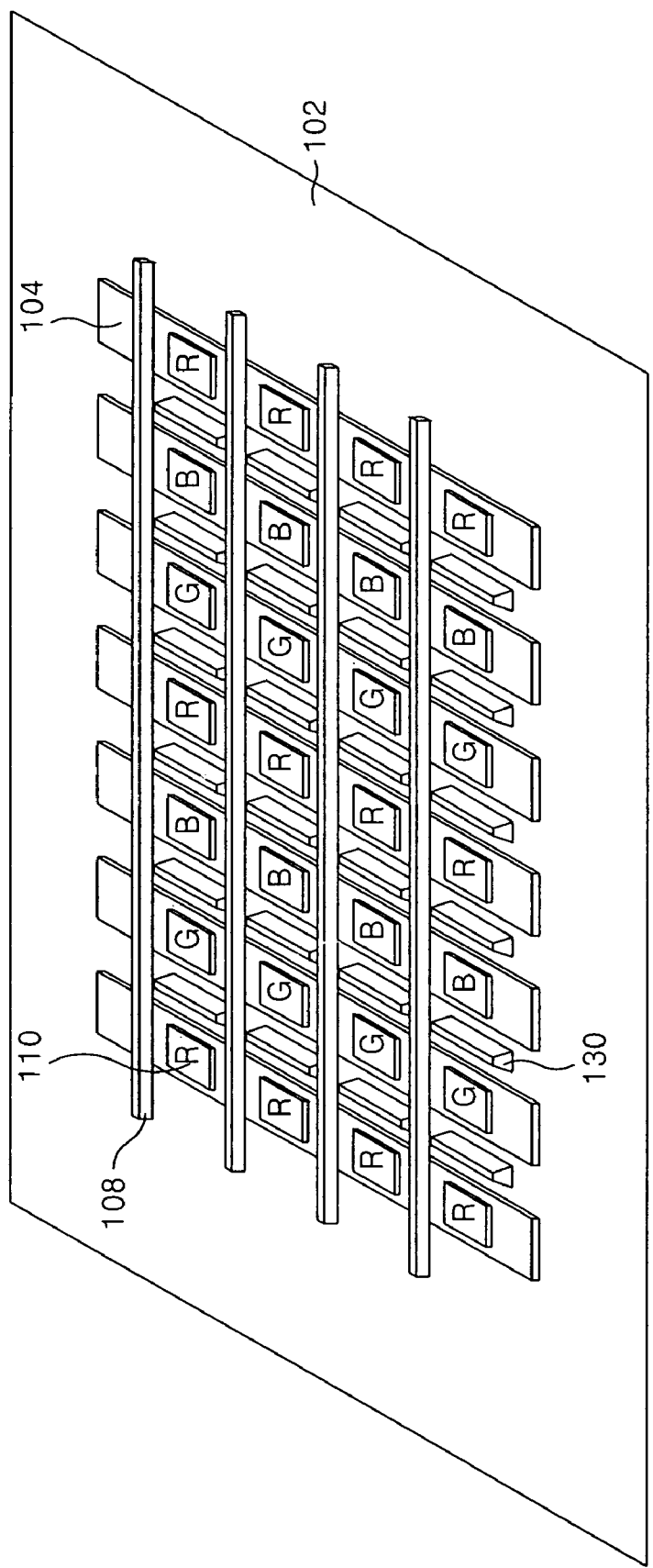

As shown in FIG. 6D, the organic light-emitting layer 110 is formed on the substrate 102 provided with the second barrier rib 130 by utilizing a shadow mask (not shown).

Figure 6E:
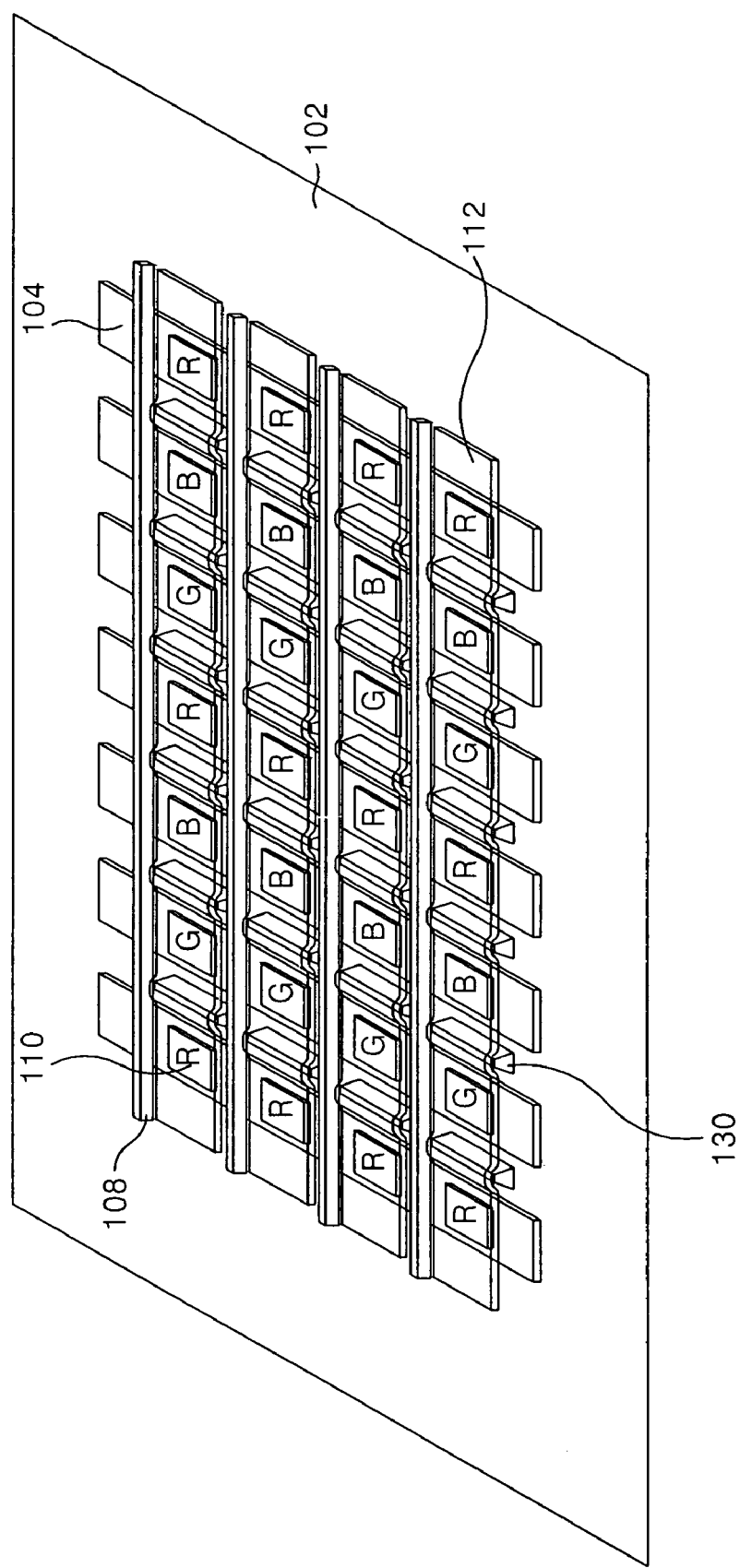

As shown in FIG. 6E, the cathode electrode 112 is formed by depositing a metal material onto the substrate 102 provided with the organic light-emitting layer 110.

As described above, the organic ELD according to the first embodiment of the present invention includes the second barrier rib 130 located between the first barrier ribs 108 for dividing the EL cells implementing the same color and positioned between the EL cells implementing different colors, thereby providing the organic light-emitting layer 110 at an accurate location.

Figure 7:
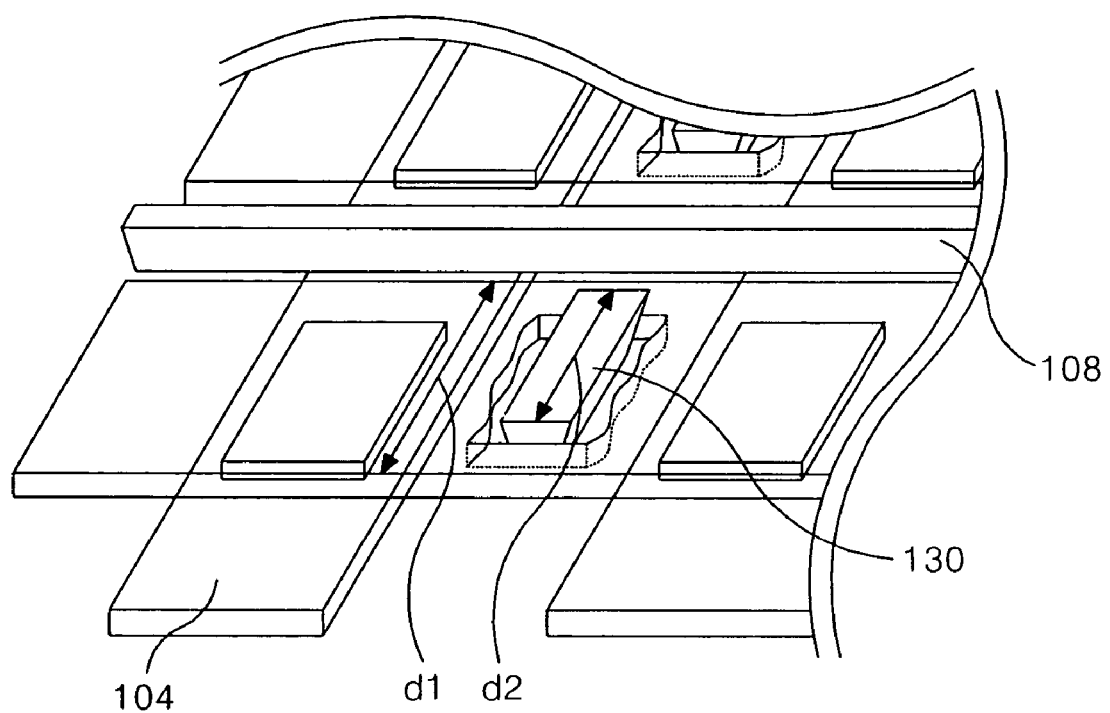
FIG. 7 is a perspective plan view showing a portion of an organic electro-luminescence device according to a second embodiment of the present invention.

FIG. 7 shows a portion of an organic electro-luminescence device (ELD) according to a second embodiment of the present invention.

The organic ELD shown in FIG. 7 has the same elements as the organic ELD shown in FIG. 4 except that both the first and second barrier ribs 108 and 130 have the backward taper structure. Therefore, the elements identical to those in FIG. 4 will be given by the same reference numerals, and a-detailed explanation as to the same elements will be omitted.

The first barrier rib 108 is provided in a direction crossing the anode electrode 104 to divide the EL cells implementing the same color, whereas the second barrier rib 130 makes a direction perpendicular to the first barrier rib 108 and is positioned between the EL cells implementing, thereby allowing the organic light-emitting layer 110 to be provided at an accurate location.

The cathode electrode 112 is provided in such a manner to be broken at an area corresponding to the second barrier rib 130 by the second barrier rib 130 having a backward taper structure, but is provided such that a line width d1 thereof is larger than a length d2 of the second barrier rib 130, thereby allowing it to be electrically connected to the second barrier rib 130 at an area other than an area overlapping with the second barrier rib 130.

A method of fabricating the organic ELD according to the second embodiment of the present invention has the same steps as that shown in FIG. 6A to FIG. 6E except that the first and second barrier ribs 108 and 130 having the backward taper structure are formed simultaneously by depositing a photosensitive organic material onto the substrate provided with the anode electrode 104 and the insulating film and then patterning it by the photolithography and the etching process. Therefore, a detailed explanation as to it will be omitted.

As described above, in the organic ELD according to the second embodiment of the present invention and the fabricating method thereof, the second barrier rib 130 having the forward taper structure is further provided in such a manner to be perpendicular to the first barrier rib 108 and parallel to the anode electrode 105 and in such a manner to be positioned between the sub-pixels for implementing different colors. Accordingly, even though the specific organic material 121 having passing through a slot 124 of the shadow mask 122 is widely spread, the second barrier rib 130 positioned between the sub-pixels prevents the specific organic material 121 from being secured onto the adjacent sub-pixel (i.e., the light-emitting area for implementing a green (G) color or a blue (B) color). As a result, the organic light-emitting layer 110 is provided at an accurate location to thereby prevent a deterioration of picture quality such as a non-uniformity of picture quality.

As described above, according to the present invention, the second barrier rib located between the first barrier ribs for dividing the EL cells implementing the same color and positioned between the EL cells implementing different colors is further provided. The second barrier rib can prevent an organic light-emitting material corresponding to a specific EL cell from being secured onto the adjacent different EL cells. Accordingly, the red, green and blue organic light-emitting layers are provided at an accurate location, so that it becomes possible to prevent a deterioration of picture quality.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro-luminescence display, comprising:
   a continuous line-shaped first barrier rib provided between adjacent organic electro-luminescence cells along a first direction; and
   an island-shaped second barrier rib provided between said adjacent organic electro-luminescence cells along a second direction,
   wherein the first and second barrier ribs are disposed on a same plane, the second barrier rib is positioned between the first barrier ribs without touching the first barrier ribs, and the second barrier rib has a larger width as it goes from a lower portion on said plane into an upper portion.

2. The organic electro-luminescence display according to claim 1, wherein the second barrier rib is formed from the same material as the first barrier rib.

3. The organic electro-luminescence display according to claim 1, wherein the second barrier ribs have a substantially equal height.

4. The organic electro-luminescence display according to claim 1, wherein the adjacent organic electro-luminescence cells include at least one of red, green and blue pixels.

5. The organic electro-luminescence display according to claim 1, wherein the adjacent organic electro-luminescence cells have an equal color in a longitudinal direction or in a transverse direction.

6. The organic electro-luminescence display according to claim 1, wherein the second barrier ribs are positioned to be spaced apart from each of the first barrier ribs.

7. A method of fabricating an organic electro-luminescence display, the method comprising:
 forming a continuous line-shaped first barrier rib between adjacent organic electro-luminescence cells along a first direction; and
 forming an island-shaped second barrier rib between said adjacent organic electro-luminescence cells along a second direction,
 wherein the first and second barrier ribs are disposed on a same plane, the second barrier rib is positioned between the first barrier ribs without touching the first barrier ribs, and the second barrier rib has a larger width as it goes from a lower portion on said plane into an upper portion.

8. The method according to claim 7, wherein the second barrier rib is formed from the same material as the first barrier rib.

9. The method according to claim 7, wherein the second barrier ribs have a substantially equal height.

10. The method according to claim 7, wherein the adjacent organic electro-luminescence cells include at least one of red, green and blue pixels.

11. The method according to claim 7, wherein the adjacent organic electro-luminescence cells have an equal color in a longitudinal direction or in a transverse direction.

12. The method according to claim 7, wherein the second barrier ribs are positioned to be spaced apart from each of the first barrier ribs.

13. An organic electro-luminescence display, comprising:
 at least one continuous line-shaped first barrier rib provided between adjacent organic electro-luminescence cells along a first direction; and
 an island-shaped second barrier rib provided between said adjacent organic electro-luminescence cells along a second direction,
 wherein the first and second barrier ribs are disposed on a same plane, the second barrier rib is positioned between the first barrier ribs without touching the first barrier ribs, and the second barrier rib has a larger width as it goes from a lower portion on said plane into an upper portion.

14. The organic electro-luminescence device according to claim 13, wherein the adjacent organic electro-luminescence cells include at least one of red, green and blue pixels.

15. The organic electro-luminescence device according to claim 13, wherein the adjacent organic electro-luminescence cells have an equal color in a longitudinal direction or in a transverse direction.

16. The organic electro-luminescence device according to claim 13, wherein the second barrier ribs are positioned to be spaced apart from each of the first barrier ribs.

* * * * *